United States Patent
Eichler et al.

(10) Patent No.: US 9,385,507 B2
(45) Date of Patent: Jul. 5, 2016

(54) SEMICONDUCTOR LASER LIGHT SOURCE HAVING AN EDGE-EMITTING SEMICONDUCTOR BODY

(71) Applicant: OSRAM Opto Semiconductors GmbH, Regensburg (DE)

(72) Inventors: Christoph Eichler, Tegernheim (DE); Andreas Breidenassel, Bad Abbach (DE); Alfred Lell, Maxhuette-Haidhof (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 14/968,845

(22) Filed: Dec. 14, 2015

(65) Prior Publication Data
US 2016/0099547 A1   Apr. 7, 2016

Related U.S. Application Data

(62) Division of application No. 14/396,729, filed as application No. PCT/EP2013/058217 on Apr. 19, 2013, now Pat. No. 9,214,785.

(30) Foreign Application Priority Data

Apr. 23, 2012 (DE) .......................... 10 2012 103 549

(51) Int. Cl.
*H01S 5/00* (2006.01)
*H01S 5/10* (2006.01)
(Continued)

(52) U.S. Cl.
CPC ............. *H01S 5/1003* (2013.01); *H01S 5/0264* (2013.01); *H01S 5/22* (2013.01)

(58) Field of Classification Search
CPC ....... H01S 5/1003; H01S 5/22; H01S 5/0264; H01S 5/1017
USPC ............................................... 372/45.01, 54
See application file for complete search history.

(56) References Cited

U.S. PATENT DOCUMENTS

| 5,252,513 A | 10/1993 | Paoli et al. |
| 2007/0133648 A1 | 6/2007 | Matsuda et al. |
| 2008/0089374 A1 | 4/2008 | Eichler et al. |

FOREIGN PATENT DOCUMENTS

| DE | 102008013896 A1 | 6/2009 |
| DE | 102008012859 A1 | 11/2009 |

(Continued)

OTHER PUBLICATIONS

Huang, et al., Study of Hydrogen Ion-Implanted Characteristic of Thin-Film Green Resonant-Cavity Light-Emitting IEEE Phototonics Technology Letters, Mar. 15, 2010, 404-406, vol. 22, No. 6.

(Continued)

Primary Examiner — Tuan Nguyen
(74) Attorney, Agent, or Firm — McDermott Will & Emery LLP (57) ABSTRACT

A semiconductor laser light source comprising an edge-emitting semiconductor body (10) is provided. The semiconductor body (10) contains a semiconductor layer stack (110) having an n-type layer (111), an active layer (112) and a p-type layer (113) which is formed for generating electromagnetic radiation which comprises a coherent portion (21). The semiconductor laser light source is formed for decoupling the coherent portion (21) of the electromagnetic radiation from a decoupling surface (101) of the semiconductor body (10) which is inclined with respect to the active layer (112). The semiconductor body (10) comprises a further external surface (102A, 102B, 102C) which is inclined with respect to the decoupling surface (101) and has at least one light-diffusing sub-region (12, 12A, 12B, 12C, 120A, 120B) which is provided in order to direct a portion of the electromagnetic radiation generated by the semiconductor layer stack (110) in the direction towards the further external surface (102A, 102B, 102C).

18 Claims, 8 Drawing Sheets

(51) Int. Cl.
*H01S 5/22* (2006.01)
*H01S 5/026* (2006.01)

(56) References Cited

FOREIGN PATENT DOCUMENTS

| DE | 102008058435 A1 | 6/2010 |
|---|---|---|
| DE | 102010015197 A1 | 1/2012 |
| DE | 102010043693 A1 | 3/2012 |
| EP | 0468482 A2 | 1/1992 |
| JP | S5871676 A | 4/1983 |
| JP | S59128756 A | 7/1984 |
| JP | S61114588 A | 6/1986 |
| JP | 2003249713 A | 9/2003 |
| JP | 2010212347 A | 9/2010 |
| WO | WO-2009/039811 A2 | 4/2009 |
| WO | WO2009/080012 * | 7/2009 .............. H01S 5/028 |
| WO | WO-2009/080012 A1 | 7/2009 |
| WO | WO-2011/128233 A1 | 10/2011 |
| WO | WO-2013/026655 A1 | 2/2013 |

OTHER PUBLICATIONS

Ikeda, et al. "High power GaN-based semiconductor lasers", phys. stat. sol. vol. 1, No. 6; (2004),1461-1467.
Uchida, et al. "Recent Progress in High-Power Blue-Violet Lasers", IEEE Journal of Selected Topics in Quantum Electronics, Sep./Oct. 2003, 1254-1259, vol. 9, No. 5.

* cited by examiner

SEMICONDUCTOR LASER LIGHT SOURCE HAVING AN EDGE-EMITTING SEMICONDUCTOR BODY

CROSS-REFERENCE TO RELATED APPLICATIONS

This application is a divisional application of U.S. patent application Ser. No. 14/396,729, filed Oct. 23, 2014, which is the national stage of International Patent Application No. PCT/EP2013,058217, filed Apr. 19, 2013; which claims the benefit of priority under 35 U.S.C. §119 of German Patent Application No. 102012103549.0 filed on Apr. 23, 2012, all of which are hereby incorporated by reference in their entirety for all purposes.

DESCRIPTION

The present disclosure relates to a semiconductor laser light source having an edge-emitting semiconductor body.

A semiconductor laser light source having an edge-emitting semiconductor body is disclosed e.g. in document WO 2009/080012 A1.

A problem with conventional semiconductor laser light sources is that deviations in the far field of the emitted laser radiation from the Gaussian beam profile can lead to inadequate reproduction characteristics.

It is an object of the present disclosure to specify a semiconductor laser light source which has the least possible disturbance in the far field and can be operated efficiently with particularly stable output power.

This object is achieved by a semiconductor laser light source in accordance with claim 1. Advantageous embodiments and developments of the semiconductor laser light source are described in the dependent claims, the disclosure content of which is hereby explicitly incorporated into the description.

A semiconductor laser light source is specified. The semiconductor laser light source comprises a semiconductor body. The semiconductor body contains a semiconductor layer stack having an n-type layer, an active layer and a p-type layer. The direction in which the n-type layer, the active layer and the p-type layer follow one another is defined hereinafter as the "vertical direction".

Each of these layers can be composed of a plurality of individual layers. For example, the n-type layer can comprise an n-type semiconductor substrate and a likewise n-type semiconductor layer which is produced on the n-type semiconductor substrate and in particular is epitaxially grown thereon. The active layer contains e.g. a sequence of individual layers, by means of which a quantum well structure, in particular a single quantum well structure (SQW) or multiple quantum well structure (MQW) is formed.

The semiconductor layer stack is formed for generating an electromagnetic radiation which comprises a coherent portion. For example, the semiconductor laser light source, preferably the semiconductor body, contains a resonator for this purpose. In particular, the coherent portion of the electromagnetic radiation is laser radiation, e.g. infrared, visible or ultraviolet laser radiation. The coherent portion can be e.g. laser radiation in the fundamental mode of the resonator.

For example, the semiconductor body is based upon the semiconductor material InGaN. In this case, it can emit e.g. electromagnetic radiation, the coherent portion of which has an intensity maximum in the blue or green spectral range. Alternatively, the semiconductor layer stack can be based e.g. upon the semiconductor material InGaAs. In this case, the coherent portion has e.g. an intensity maximum in the infrared spectral range.

The electromagnetic radiation emitted by the semiconductor layer stack during operation of the semiconductor laser light source contains in particular a further portion which is not encompassed by the coherent portion. For example, the semiconductor layer stack emits a further coherent portion of electromagnetic radiation and/or an incoherent electromagnetic radiation. The further coherent portion can be e.g. higher order laser modes, e.g. parasitic substrate and/or waveguide modes.

The semiconductor body is in particular an edge-emitting semiconductor body. This means that the semiconductor body comprises a decoupling surface, sometimes also called a "facet", which is inclined towards the active layer, in particular is perpendicular to the active layer. In an expedient manner, the semiconductor laser light source is formed for decoupling the coherent portion of the electromagnetic radiation from the decoupling surface of the semiconductor body.

In the case of one embodiment, the edge-emitting semiconductor body has a transverse lateral surface opposite to the decoupling surface. The transverse lateral surface is preferably mirror-coated and forms together with the decoupling surface the resonator. Furthermore, the semiconductor body can have two mutually opposite longitudinal side surfaces which extend in particular from the decoupling surface towards the transverse lateral surface. The decoupling surface, the transverse lateral surface and/or the longitudinal side surfaces extend in particular from a top-side external surface to an n-side external surface—opposite to the p-side external surface—of the semiconductor body.

In the case of one embodiment, the semiconductor body comprises a ridge which is designated hereinafter as a waveguide ridge. The waveguide ridge is formed by the semiconductor layer stack and has a main extension direction which extends preferably in the direction of a normal vector onto the decoupling surface. A "ridge" in accordance with the present disclosure is formed in particular in such a manner that, as seen in a plan view of the p-side external surface of the semiconductor body, the ridge has in its main extension direction at least twice the extension, preferably at least five-times the extension, as perpendicular thereto. The waveguide ridge extends e.g. from the decoupling surface to the transverse lateral surface of the semiconductor body. It is formed e.g. by structuring a p-side surface of the semiconductor body.

The semiconductor body comprises a further external surface which is inclined towards the decoupling surface and in particular is perpendicular to the decoupling surface. For example, the further external surface is one or a plurality of the following surfaces: longitudinal side surface, p-side external surface, n-side external surface.

Moreover, the semiconductor body has at least one light-diffusing sub-region which is provided in order to direct a portion of the electromagnetic radiation generated by the semiconductor layer stack in the direction of the further external surface. For example, the light-diffusing sub-region diffuses the further coherent portion of the electromagnetic radiation and/or the incoherent portion of the electromagnetic radiation at least partly in the direction of the further external surface.

The light-diffusing sub-region can additionally direct electromagnetic radiation, which is generated by the semiconductor layer stack, in the direction towards other external surfaces of the semiconductor body, in particular by means of scattering. In an expedient manner, it is suitable for reducing the intensity—impinging upon the decoupling surface—of the portion of electromagnetic radiation not encompassed by the coherent portion. For example, electromagnetic radiation from parasitic substrate and/or waveguide modes can be directed away from the decoupling surface by means of the light-diffusing sub-region.

In this context, the fact that the semiconductor body comprises at least one light-diffusing sub-region is understood to mean that it comprises precisely one light-diffusing sub-region or that it comprises a plurality of light-diffusing sub-regions. For example, it comprises a first light-diffusing sub-region and a second light-diffusing sub-region which are provided in each case in order to direct a portion of the electromagnetic radiation, which is generated by the semiconductor layer stack, in the direction towards the further external surface. The semiconductor body can also comprise different light-diffusing sub-regions which are provided in order to direct electromagnetic radiation, which is emitted by the semiconductor layer stack, to different further external surfaces of the semiconductor body.

The inventors have established that the intensity of the portion of the electromagnetic radiation which is diffused by the at least one light-diffusing sub-region in the direction towards the further external surface changes linearly or at least approximately linearly with the intensity of the coherent portion decoupled by the decoupling surface. The diffused radiation directed by the light-diffusing sub-region towards the external surface can thus advantageously be measured and preferably used for controlling or regulating an operating current through the semiconductor layer stack.

At the same time, it is possible in this manner to achieve a particularly high beam quality of the laser radiation radiated from the decoupling surface. For example, the fraction of higher order laser modes is particularly small which means that the beam profile deviates to a particularly small extent from a Gaussian form. In particular, the beam profile does not comprise, or comprises only slight, side peaks or waves (so-called "ripples"). The light-diffusing sub-region advantageously in particular does not have an unfavourable effect upon typical laser characteristics, such as lasing threshold and slope.

In addition, it is not necessary to lower the mirror-coating of the transverse lateral surface which is opposite to the decoupling surface, in order to be able to measure the intensity of the coherent portion of the electromagnetic radiation, as is typically the case with conventional semiconductor laser light sources.

In accordance with at least one embodiment, the at least one light-diffusing sub-region extends starting from the p-type layer or starting from the n-type layer into the active layer or through the active layer. In this manner, lateral disturbances of the beam profile can be reduced in a particularly effective manner.

In the case of a further embodiment, in which the at least one light-diffusing sub-region extends at least in the p-type layer, it is laterally spaced apart from the waveguide ridge at least in the region of the p-type layer. In the case of one development, the lateral spaced interval is ≤20 µm, preferably ≤5 µm and particularly preferably ≤2 µm. In particular, if the semiconductor laser light source comprises a plurality of light-diffusing sub-regions, each of the sub-regions extending at least in the p-type layer is laterally spaced apart from the waveguide ridge at least in the region of the p-type layer.

In the case of the semiconductor laser light source in accordance with this embodiment, the height of the waveguide ridge can be selected to be particularly big, whereby it is advantageously possible to achieve a particularly small p-side current expansion. Without the light-diffusing sub-region, in order to suppress higher order laser modes the shape of the waveguide ridge would have to be selected in such a manner that only the fundamental mode of the edge-emitting semiconductor body can begin to oscillate. The waveguide ridge should then be able to have only a comparatively smaller height. However, this can lead to an undesirably high threshold current by reason of a comparatively large p-side current expansion.

Furthermore, e.g. in the case of the semiconductor laser light source in accordance with this embodiment, it is possible to omit the use of absorber layers at the side of the waveguide ridge, which absorber layers also damp the fundamental mode of the laser radiation. It is thus possible to achieve a particularly high level of efficiency.

In the case of one embodiment, the first light-diffusing sub-region extends e.g. at least in the p-type layer, in the case of one development it extends from the p-type layer into the active layer or through the active layer into the n-type layer.

In the case of this embodiment, the second light-diffusing sub-region extends at least in the n-type layer. In the case of one development, it extends exclusively in the n-type layer, wherein it extends e.g. over at least 10%, preferably over at least 30% and particularly preferably over at least 50% of a thickness of the n-type layer.

In the case of one development, the first light-diffusing sub-region and the second light-diffusing sub-region do not overlap or overlap only partially in the vertical direction as seen in a plan view of the decoupling surface. In the case of another development, the first and the second light-diffusing sub-regions overlap as seen in a plan view of the p-side outer surface. In this case, the second light-diffusing sub-region can overlap with the waveguide ridge and the first light-diffusing sub-region can be laterally spaced apart from the waveguide ridge.

By means of the first and the second light-diffusing sub-regions, it is possible to achieve e.g. a particularly good beam quality of the coherent electromagnetic radiation, which is decoupled from the decoupling surface, both in a lateral direction and in the vertical direction. In this case, the light-diffusing sub-region which extends in the n-type layer contributes e.g. to the diffusion of laser modes which are guided in the n-type layer, in particular in the substrate, so that a particularly good radiation characteristic can be achieved in the vertical direction with the second light-diffusing sub-region.

In accordance with at least one embodiment, in order to form the at least one light-diffusing sub-region a cavity is formed in the semiconductor body. The cavity can be produced e.g. by means of a wet etching method, a dry etching method or by means of spatially selective epitaxial growth. The cavity can be filled with gas, in particular it can be filled with air. In particular, the cavity is partially or completely filled with a material which comprises a refractive index which is different from the surrounding semiconductor material.

In the case of another embodiment, the at least one light-diffusing sub-region is formed by means of a material composition and/or by means of a crystal structure which deviates from the material composition or crystal structure which a region of the semiconductor body adjoining the light-diffusing sub-region comprises. For example, the light-diffusing sub-region can comprise a semiconductor composition or doping which is different from the adjoining region, or it can be provided with defects, e.g. by means of a so-called stealth-dicing method.

In the case of another embodiment, the at least one light-diffusing sub-region is formed by means of a transverse ridge which is applied at the side of the waveguide ridge onto the semiconductor layer stack or is formed by the semiconductor layer stack. The transverse ridge has in particular a main extension direction which is different from the main extension direction of the waveguide ridge. In the case of one development, the main extension directions of the waveguide ridge and transverse ridge extend perpendicularly with respect to one another.

In the case of one development, the transverse ridge is laterally spaced apart from the waveguide ridge.

If the transverse ridge is formed by the semiconductor layer stack it can be produced—like the waveguide ridge itself—by means of an etching method by structuring the p-side surface of the semiconductor layer stack. However, the material of the transverse ridge does not need to be a semiconductor material, another material can also be applied onto the semiconductor layer stack, in order to form the transverse ridge. For example, in this case the transverse ridge preferably has a refractive index which is different from the refractive index of the waveguide ridge.

In the case of one development, the semiconductor laser light source comprises a plurality of transverse ridges which follow one another in the direction of the main extension direction of the waveguide ridge. Preferably, they follow one another periodically and form in particular a distributed Bragg reflector (DBR). In the case of another development, transverse ridges are arranged on both sides next to the waveguide ridge. For example, as seen in a plan view of the p-side external surface, two transverse ridges which are arranged on different sides of the waveguide ridge follow one another in each case in a direction perpendicular to the main extension direction of the waveguide ridge.

In accordance with a further embodiment, the at least one light-diffusing sub-region has a main extension plane which extends in an inclined manner with respect to the vertical direction, in which the n-type layer, the active layer and the p-type layer follow one another. For example, the main extension plane extends in an oblique manner with respect to the vertical direction and in parallel with the main extension direction of the waveguide ridge which in particular is in parallel with the normal vector onto the decoupling surface. In the case of one development, the light-diffusing sub-region extends from the decoupling surface as far as the opposite transverse lateral surface.

By means of a light-diffusing sub-region whose main extension plane extends in an inclined manner with respect to the vertical direction, undesired radiation can be diffused away from the waveguide ridge in a particularly effective manner.

The main extension plane of the light-diffusing sub-region is spanned in particular by the two directions in which it has its largest dimensions. If the light-diffusing sub-region is in the form e.g. of a cuboid, its main extension plane is spanned by the directions of the two longest edges. The dimensions of the light diffusing sub-region in the main extension plane are e.g. at least twice as large, preferably at least five times as large, as its dimension perpendicular to the main extension plane.

In the case of another embodiment, the at least one light-diffusing sub-region has a main extension plane which extends in an inclined manner with respect to the normal vector onto the decoupling surface. In particular, it extends in an oblique manner with respect to the normal vector onto the decoupling surface and in parallel with the vertical direction.

In the case of one embodiment, the light-diffusing sub-region is formed in a U-shaped manner as seen in a plan view of its main extension plane. Such an embodiment is particularly well suited for a light-diffusing sub-region whose main extension plane extends in an oblique manner with respect to the normal vector onto the decoupling surface and in particular in parallel with the vertical direction.

Preferably, the U-shaped, light-diffusing sub-region encloses a section of the active layer. In this manner, an undesired portion of the electromagnetic radiation generated by the semiconductor layer stack can be shielded in a particularly effective manner from the decoupling surface and can be directed towards the further external surface.

It is possible to achieve a particularly good shielding effect if the at least one light-diffusing sub-region or at least one of the light-diffusing sub-regions is arranged in the vicinity of the decoupling surface. The phrase "in the vicinity of the decoupling surface" means in particular that the spaced interval of the light-diffusing sub-region with respect to the transverse lateral surface is at least twice as large, preferably at least four times as large as the spaced interval with respect to the decoupling surface.

In accordance with at least one embodiment, the semiconductor laser light source comprises a photodiode which is arranged on or above the further external surface of the semiconductor body. In the case of another embodiment, the photodiode is integrated monolithically into the semiconductor body. The photodiode expediently generates an electrical signal in dependence upon the intensity of the electromagnetic radiation received thereby.

In the case of the semiconductor laser light source in accordance with the present disclosure, the photodiode can advantageously be arranged laterally next to the waveguide ridge, so that a particularly small dimension of the semiconductor laser light source can be achieved in the main extension direction of the waveguide ridge.

A photodiode which is integrated monolithically into the semiconductor body is particularly cost-effective and space-saving and does not require any further assembly steps after completion of the semiconductor body. By means of the monolithic integration, a particularly large fraction of the diffused light deflected from the light-diffusing sub-region can be absorbed by the photodiode.

The semiconductor laser light source is formed in particular for the purpose of irradiating the photodiode with a portion of the electromagnetic radiation generated by the semiconductor layer stack. In an advantageous manner, no reduction in the mirror-coating of the transverse lateral surface is required for this purpose. By means of the light-diffusing sub-region, a satisfactory incidence of radiation onto the photodiode can still be achieved.

Therefore, in the case of one development, if the photodiode is arranged on or above the further external surface of the semiconductor body, then as seen in a plan view of the further external surface at least one region of the further external surface which overlaps with the photodiode is roughened or provided with macroscopic decoupling structures. In this context, decoupling structures are defined as "macroscopic" if they are 10 μm or more at least in one dimension.

In accordance with one development, if the photodiode is integrated monolithically into the semiconductor body, then a material having a refractive index which is larger than a refractive index of the photodiode and than a refractive index of the active layer is arranged between the photodiode and the active layer. In particular, the material is an isolator.

In the case of one embodiment, the photodiode extends longitudinally of the waveguide ridge over a large part of the semiconductor body, so that its length is in particular 80% or more of the length of the waveguide ridge—that is to say, of its dimension in the main extension direction. In the case of another embodiment, the photodiode is arranged in the vicinity of the decoupling surface, in particular its spaced interval with respect to the transverse lateral surface opposite to the decoupling surface is at least twice as large, preferably at least four times as large, as the spaced interval with respect to the decoupling surface.

A photodiode which does not extend over a large part of the length of the semiconductor body can react, by reason of its lower capacity, in a particularly rapid manner to intensity changes of the electromagnetic radiation generated by the semiconductor layer stack.

In the case of a further embodiment, the semiconductor laser light source comprises an electrical circuit. The electrical circuit is provided e.g. to supply operating current to the semiconductor layer stack. In addition, it is preferably provided in order to evaluate the electrical signal of the photodiode and, during operation of the semiconductor laser light source, to control the operating current through the semiconductor layer stack in dependence upon the electrical signal of the photodiode. For this purpose, the electrical circuit is, in an expedient manner, electrically connected to the semiconductor layer stack and to the photodiode.

The semiconductor laser light source is provided e.g. for use in a laser projector, for which semiconductor bodies based on InGaN are particularly well suited. It can also be used in a 3D scanner, for which semiconductor bodies based on InGaAs are particularly well suited.

Laser projection applications and 3D scanning applications place considerable requirements on focus capability and/or collimation capability of the laser light source. For this purpose, a good beam quality, in particular a Gaussian or virtually Gaussian beam profile, as can be achieved with the semiconductor laser light source in accordance with the present disclosure, is particularly advantageous.

The semiconductor laser light source comprising the photodiode and the electrical circuit advantageously has a particularly long service life. The service life defines in particular the operating time of the semiconductor laser light source until a specified tolerance of one of its operating parameters, in particular light intensity and/or lighting current, is exceeded. In the case of an example of the operating procedure of the semiconductor laser light source, the electrical circuit detects, by means of the signal of the photodiode, a deviation in the light intensity or lighting current of the semiconductor laser light source from a specified desired value and changes the operating current through the semiconductor layer sequence in dependence upon the signal of the photodiode such that the deviation is minimised.

Further advantages and advantageous embodiments and developments of the semiconductor laser light source are apparent from the following exemplified embodiments illustrated in conjunction with the figures, in which.

Identical or similar elements, or elements acting in an identical manner, are provided with the same reference numerals in the figures. The figures and the size ratios of the elements illustrated in the figures with respect to each other are not to be regarded as being to scale. Rather, individual elements may be illustrated excessively large to provide a clearer illustration and/or for ease of understanding.

Figure 1A:
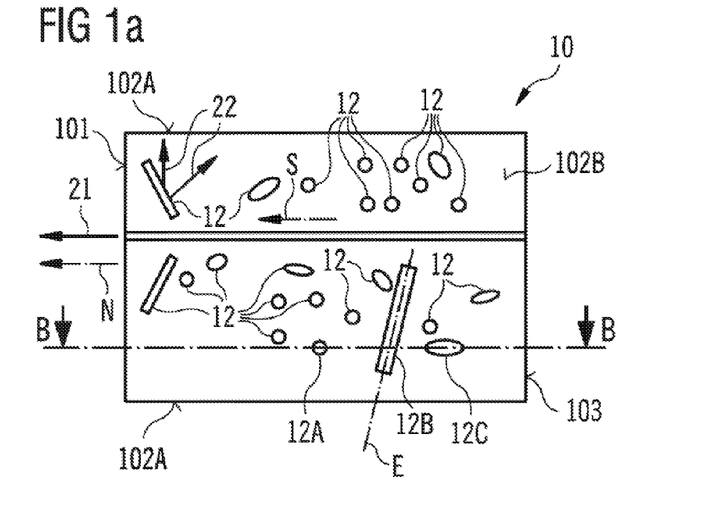
FIG. 1A shows a schematic plan view of a semiconductor body of a first laser light source.

FIG. 1A illustrates a schematic plan view of a semiconductor body 10 of a laser light source in accordance with a first exemplified embodiment.

Figure 1B:
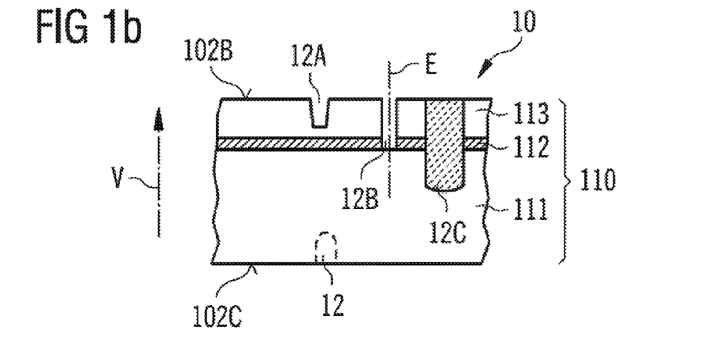
FIG. 1B shows a schematic cross-section of the semiconductor body of FIG. 1A in the sectional plane B-B.

FIG. 1B illustrates a schematic cross-section of the semiconductor body 10 of the laser light source in accordance with the first exemplified embodiment in the plane B-B which is indicated in FIG. 1A.

The semiconductor body 10 contains a semiconductor layer stack 110 which is formed by an n-type layer 111, an active layer 112 and a p-type layer 113 which follow one another in this sequence in a direction V which is designated as the vertical direction.

The n-type layer 111, the active layer 112 and/or the p-type layer 113 can each be formed as layer sequences. For example, the n-type layer 111 can contain a growth substrate and a semiconductor layer which is epitaxially deposited thereon. In particular, the semiconductor layer stack contains waveguide layers which include the active layer 112 for guiding the electromagnetic radiation generated therein. Such semiconductor layer stacks 110 are known in principle to the person skilled in the art and therefore will not be explained in greater detail at this juncture. An example of the structure of such a semiconductor layer stack 110 is described in document WO 2009/080012 A1, the disclosure content of which is, in this regard, hereby incorporated into the present application by reference.

The semiconductor body 10 is defined by a plurality of external surfaces: a decoupling surface 101, a mirror-coated transverse lateral surface 103 opposite to the decoupling surface, two opposite longitudinal lateral surfaces 102A, a p-side external surface 102B and an n-side external surface 102C. The decoupling surface 101, the longitudinal lateral surface 102A and the transverse lateral surface 103 are e.g. in parallel with the vertical direction V. The longitudinal lateral surfaces 102A adjoin e.g. the decoupling surface 101 and the transverse lateral surface 103 and in particular are perpendicular thereto. The longitudinal lateral surfaces 102A, the decoupling surface 101 and the transverse lateral surface 103 extend in particular from the p-side external surface 102B to the n-side external surface 102C.

The semiconductor layer stack 110 is formed for generating electromagnetic radiation which comprises a coherent portion 21. In particular, a resonator for the electromagnetic radiation is formed by the decoupling surface 101 together with the metal-coated transverse lateral surface 103.

For example, in order to achieve beam guidance of the electromagnetic radiation in the direction of a surface normal N onto the decoupling surface 101, the semiconductor layer stack 110 can comprise a waveguide ridge 114 which extends from the decoupling surface 101 to the opposite transverse lateral surface 103. Therefore, the main extension direction S of the waveguide ridge 114 is in particular in parallel with the surface normal N onto the decoupling surface 101 and perpendicular to the vertical direction V.

The semiconductor body 10 is formed for decoupling the coherent portion 21 of the electromagnetic radiation, which is generated by the semiconductor layer stack 110, from the decoupling surface 101. In particular, the decoupling surface 101 is in parallel with the vertical direction. During production of the semiconductor body, a breaking method can be used, in which the semiconductor body is separated from the wafer composite with the decoupling surface 101 being exposed. In the case of this method, it can be the case that the breaking edge is only approximately in parallel with the vertical direction. The decoupling surface 101 is also perpendicular or virtually perpendicular to the active layer 110. Such edge-emitting semiconductor bodies 10 are known in principle to the person skilled in the art—e.g. from WO 2009/080012 A1 which in this regard is already incorporated by reference—and therefore will not be explained in greater detail at this juncture.

The semiconductor body 10 of the semiconductor laser light source in accordance with the present first exemplified embodiment comprises a plurality of light-diffusing sub-regions 12. The light-diffusing sub-regions 12, 12A, 12B, 12C are provided in order to diffuse a portion of the electromagnetic radiation generated by the semiconductor layer stack 110. In particular, they are provided in order to direct a portion of the electromagnetic radiation in the direction towards a further external surface of the semiconductor body 10 which is different from the decoupling surface 101—in the present case, towards the longitudinal lateral surfaces 102A. The radiation diffused by one of the light-diffusing sub-regions 12 towards one of the longitudinal lateral surfaces 102A is designated in FIG. 1A by the reference numeral 22.

The outer contours of the light-diffusing sub-regions 12 can have different shapes. By way of example, in the plan view of the p-side external surface 102B of FIG. 1A a first light-diffusing sub-region 12A is characterised by a circular outer contour, a second light-diffusing sub-region 12B has e.g. a rectangular outer contour as seen in a plan view of the p-type layer 113, a third light-diffusing sub-region 12C has an oval, in particular elliptical, outer contour.

The light-diffusing sub-regions 12 in the case of this and the other exemplified embodiments and embodiments of the semiconductor laser light source have e.g. dimensions—in particular lateral dimensions—between 0.1 μm and 1000 μm, preferably between 1 μm and 300 μm. Light-diffusing sub-regions 12A having a circular outer contour preferably have a diameter between 1 μm and 50 μm. In the case of light-diffusing sub-regions 12B comprising a rectangular outer contour—in other words, in the case of bar-shaped light-diffusing sub-regions 12B—the short sides of the rectangle preferably have dimensions between 1 μm and 50 μm and/or the long sides of the rectangle have dimensions between 1 μm and 1000 μm, preferably between 5 μm and 300 μm. In particular, the long sides of the rectangle additionally have a longer length—preferably at least twice the length—than the short sides. In each case, the limits for all the aforementioned ranges are to be regarded as being inclusive.

The light-diffusing sub-regions 12 can be produced e.g. by means of wet etching, whereby it is possible to achieve e.g. a shape of the light-diffusing sub-region 12 which tapers in the vertical direction V, as illustrated by way of example in FIG. 1B with the aid of the first light-diffusing sub-region 12A. The light-diffusing sub-regions 12 can also be substantially cuboidal, as illustrated by way of example with the aid of the second light-diffusing sub-region 12B. Such a shape can be achieved e.g. by means of dry etching. Light-diffusing sub-regions 12 produced e.g. by etching constitute cavities in the semiconductor body 10 and generally comprise an opening at an external surface of the semiconductor body 10, in the present case at the p-side external surface 102B. They are filled in particular with gas, preferably with air.

Alternatively, light-diffusing sub-regions 12 can be produced by means of a method which is known in principle to the person skilled in the art by the term "stealth dicing". In the case of this method, the semiconductor body is illuminated by a focussed laser beam, wherein the focal point of the laser beam is positioned within the semiconductor layer stack. The crystal structure of the semiconductor material of the semiconductor layer stack 110 is changed in this manner in the region of the focal point. By means of a relative movement of the laser beam with respect to the semiconductor body 10, a light-diffusing sub-region having the desired shape and size can be produced in this manner. In particular, light-diffusing sub-regions 12 which are produced by means of a stealth dicing method comprise semiconductor material having a defect structure consisting of a multiplicity of bubble-shaped hollow spaces, as indicated for the third sub-region 12C in FIG. 1B.

Preferably, a main extension plane E of the light-diffusing structures 12 extends at an angle with respect to the main extension direction S of the waveguide ridge 114. The waveguide ridge 114 and the main extension plane E are, in other words, preferably not in parallel with one another. For example, the main extension plane E extends in parallel with the vertical direction V. In this case, the main extension plane E is the plane which is established by the two directions in which the light-diffusing sub-region 12 has its two largest dimensions. For the second light-diffusing sub-region 12B, it is indicated in FIGS. 1A and 1B.

In the case of the present first exemplified embodiment, the light-diffusing sub-regions have different extensions in the vertical direction V. For example, the first light-diffusing sub-region 12A extends completely in the p-type layer 113, the second light-diffusing sub-region 12B extends starting from the p-type layer 113 into the active layer 112, and the third light-diffusing sub-region 12C extends starting from the p-type layer 113 through the active layer 112 into the n-type layer 111.

In the vertical direction V—e.g. as seen in a plan view of the decoupling surface 101—the first, the second and the third light-diffusing sub-regions 12A, 12B, 12C overlap in this manner only in part. As seen in a plan view of the p-side external surface 102B, they are in this case laterally spaced apart from the waveguide ridge 114.

In the case of one variant of the first exemplified embodiment, the light-diffusing sub-regions 12 do not extend from the p-side external surface 102B but rather from the n-side external surface 102C into the semiconductor body 10. This variant is indicated in FIG. 1B by the sub-region 12 shown by the broken line. In the case of this variant, the light-diffusing sub-regions are contained e.g. completely in the n-type layer 111. In this case, they can also be arranged underneath the waveguide ridge 114. For example, they are produced by the stealth dicing method explained above.

Figure 2:
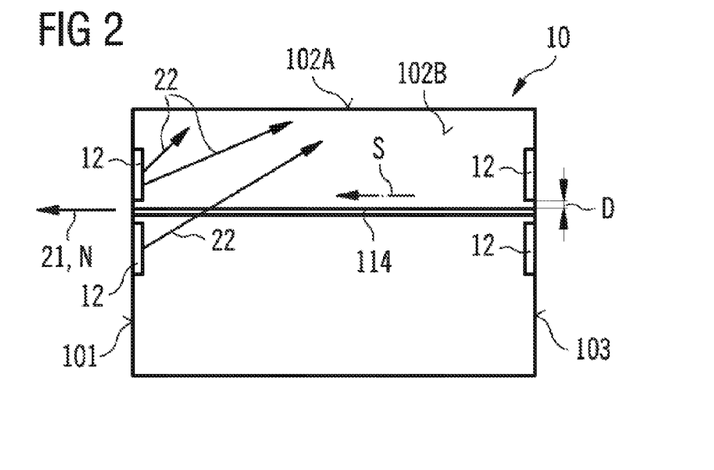
FIG. 2 shows a schematic plan view of a semiconductor body of a second laser light source.

FIG. 2 illustrates a schematic plan view of a semiconductor body 10 of a laser light source in accordance with a second exemplified embodiment.

The basic structure of the semiconductor body 10 corresponds to that of the first exemplified embodiment. However, in the case of the present second exemplified embodiment the light-diffusing sub-regions 12 are arranged at the decoupling surface 101 and at the opposite transverse lateral surface 103 of the semiconductor body 10. In contrast thereto, the light-diffusing sub-regions 12 in the case of the first exemplified embodiment are spaced apart from the lateral surfaces (decoupling surface 101, longitudinal lateral surfaces 102A and transverse lateral surface 103) of the semiconductor body 10.

For example, the light-diffusing sub-regions 12 in the case of the second exemplified embodiment extend from the p-type layer 113 into the semiconductor layer stack 110 and in particular into the active layer 112 or extend through same. Alternatively, the light-diffusing sub-regions 12 can also extend from the n-side surface 12 in the vertical direction V into the semiconductor body 10 and can extend e.g. completely within the n-type layer 111.

The light-diffusing sub-regions 12 are preferably produced before the decoupling surface 101 and the transverse lateral surface 103 of the semiconductor body 10 are exposed, preferably by means of the stealth dicing method described above. The decoupling surface 101 and the transverse lateral surface 103 are exposed e.g. by means of a breaking method. By means of the light-diffusing sub-regions 12 arranged directly at the decoupling surface 101 or the transverse lateral surface 103, the position and shape of the breaking edges can be advantageously influenced.

The light-diffusing sub-regions 12 are laterally spaced apart from the waveguide ridge 114. In this case, in particular, the lateral spaced interval D is the spaced interval perpendicular to the main extension direction S of the waveguide ridge 114 as seen in a plan view of the p-side external surface 102B. For example, the lateral spaced interval is less than 20 µm, preferably less than 5 µm and particularly preferably less than 2 µm. In one embodiment, it is greater than 0.5 µm.

By means of such spaced intervals, the light-diffusing structures 12 are particularly well suited for suppressing the emission of laser modes of higher order than the fundamental mode from the decoupling surface 101. The laser light source makes use of the different spatial intensity distribution of the different modes within the semiconductor body 10.

For this purpose, the light-diffusing sub-regions 12 diffuse laser radiation 22 of these modes e.g. in the direction towards the longitudinal lateral surfaces 102A which are perpendicular to the decoupling surface 101. In addition, in the case of this and the remaining exemplified embodiments, the light-diffusing sub-regions 12 can diffuse electromagnetic radiation generated by the active layer 112 in further directions, e.g. in the direction towards the p-side external surface 102B, the n-side external surface 102C.

Figure 3A:
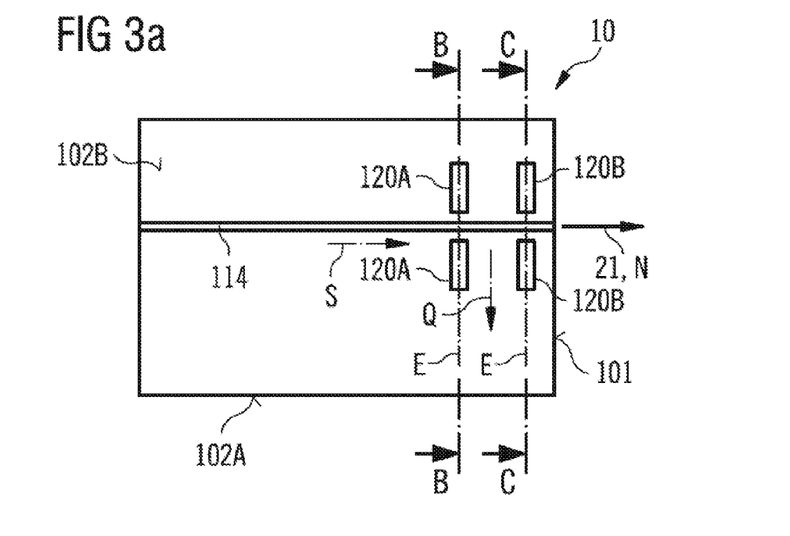
FIG. 3A shows a schematic plan view of a semiconductor body of a third laser light source.
Figure 3B:
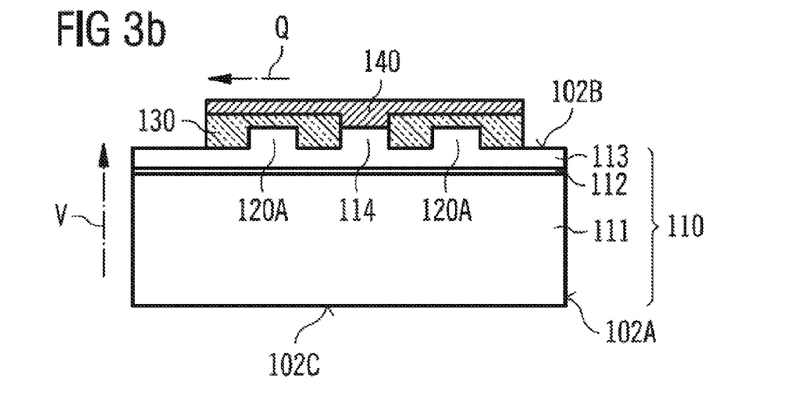
FIG. 3B shows a schematic cross-section of the semiconductor body of FIG. 3A in the sectional plane B-B.
Figure 3C:
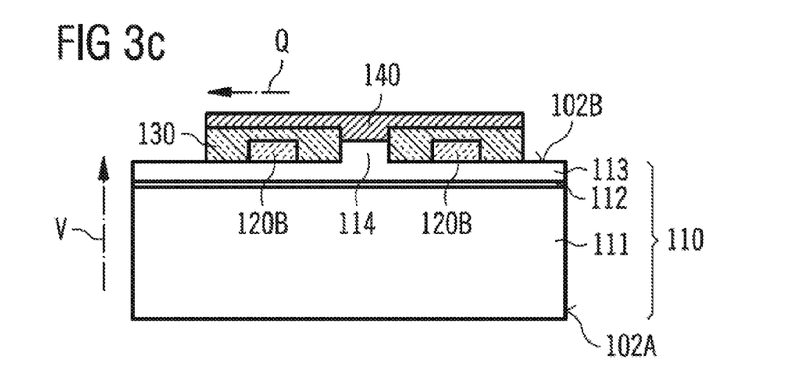
FIG. 3C shows a schematic cross-section of the semiconductor body of FIG. 3A in the sectional plane C-C.

FIG. 3A illustrates a semiconductor body 10 of a laser light source in accordance with a third exemplified embodiment in a schematic plan view. FIG. 3B illustrates the semiconductor body 10 in a schematic cross-section in the section plane B-B and FIG. 3C illustrates the semiconductor body 10 in a schematic cross-section in the sectional plane C-C.

In the case of this and the preceding exemplified embodiments, the waveguide ridge 114 of the semiconductor layer stack 110 rises in the vertical direction V beyond regions of the p-type layer 113 which laterally adjoin it, so that it constitutes a protrusion in the p-side external surface 102B. In the case of the present third exemplified embodiment, the light-diffusing sub-regions 12 are likewise formed as protrusions of the p-type layer 113, like the transverse ridges 120A, or they are applied onto a surface of the p-type layer 113, like the transverse ridges 120B.

The transverse ridges 120A, 120B have a main extension direction Q which in the present case as seen in a plan view of the p-type layer 113 extends perpendicularly with respect to the main extension direction S of the waveguide ridge 114. In the present case, the main extension plane of the transverse ridges 120A or 120B coincides with the sectional planes B-B or C-C respectively.

The transverse ridges 120A are produced in particular by means of a structuring method, in which the surface of the p-type layer 113 is structured—e.g. by means of dry etching, wet etching and/or selective epitaxial growth—for forming the waveguide ridge 114 and the first transverse ridges 120A.

The second transverse ridges 120B are produced e.g. by applying a material onto the p-side external surface 102B, which material is different from the semiconductor material of the p-type layer 113.

In the case of one variant of this exemplified embodiment, all of the transverse ridges 120A, 120B are formed by structuring the p-type layer 113. In the case of an alternative variant, all of the transverse ridges 120A, 120B are formed by applying a material, which is different from the semiconductor material of the p-type layer, onto the p-type layer 113.

In the case of a further variant, the refractive index of the transverse ridges 120A, 120B is different from the refractive index of the p-type layer 113; in particular, it is lower than the refractive index of the p-type layer 113. This can be achieved e.g. by means of an ion implantation method. The refractive index of p-GaN can be lowered e.g. in particular by implantation of protons (H$^+$), from 2.46 to 2.26.

In the case of this variant, the transverse ridges 120A, 120B are not necessarily formed as protrusions of the p-type layer 113. Instead, they can extend—in particular in an analog manner to the rectangular light-diffusing sub-regions 12B of the first exemplified embodiment—towards the n-side external surface 102C at least into the p-type layer 113 or through same.

In the case of one development of this exemplified embodiment or one of the other embodiments of the semiconductor laser light source, a current path can also be defined through the semiconductor layer stack 110 in particular by means of ion implantation and/or an index guidance of the coherent portion 21 of the electromagnetic radiation can be achieved by means of a refractive index change on both sides of the waveguide ridge 114. In order to define a current path, e.g. n-type substances such as Si, p-type substances, such as Mg, Zn, Be and/or insulating substances, such as B, He, N, H, can be implanted.

In the case of one further variant of the third exemplified embodiment, more than two transverse ridges 120A, 120B can also follow one another in the main extension direction S of the waveguide ridge 114. In the case of a preferred development of this variant, the transverse ridges 120A, 120B which follow one another in this direction are arranged periodically. In particular, they form a distributed Bragg reflector (DBR). In particular, the spaced intervals and dimensions of the transverse ridges 120A, 120B are selected such that the distributed Bragg reflector has its highest level of reflectivity for a wavelength λ of the coherent portion 21 of the electromagnetic radiation emitted by the semiconductor layer stack 110. This is also defined as a "λ/4" configuration.

In the case of this and the other exemplified embodiments, the semiconductor body 10 expediently comprises an electrode 140 for electrically connecting the semiconductor layer stack 110. A passivation 130 is preferably arranged between the electrode 140 and the p-type layer 113. The passivation 130 comprises an opening which leaves the waveguide ridge 114 open.

In this manner, the waveguide ridge 114 is electrically contacted by means of the electrode 140, in particular the electrode 140 adjoins the p-type layer 113 in the region of the waveguide ridge 114. In the case of the present exemplified embodiment, regions of the p-type layer 113 which are arranged laterally of the waveguide ridge and are covered by the electrode 140 in plan view are spaced apart from the electrode 140. For the sake of clarity, the electrode 140 and the passivation 130 are not indicated in the plan view of FIG. 3A.

Figure 4A:
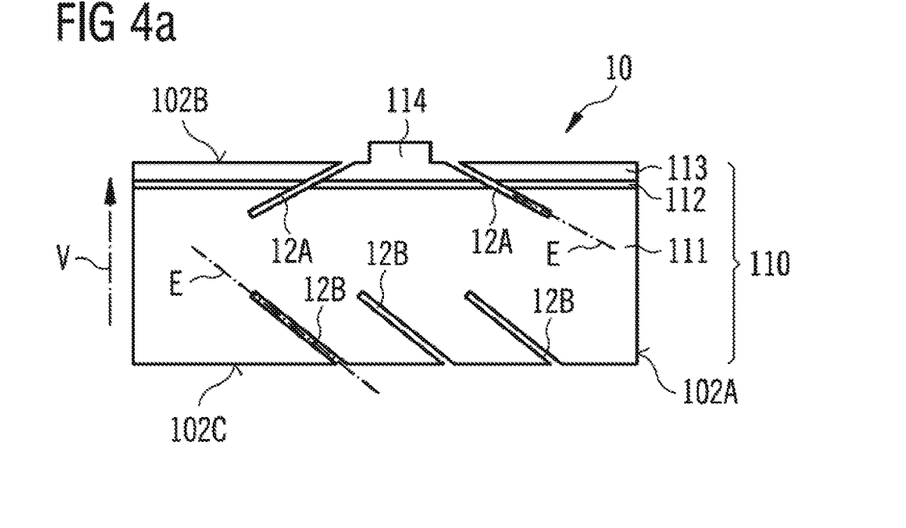
FIG. 4A shows a schematic cross-section of a semiconductor body of a fourth laser light source.
Figure 4B:
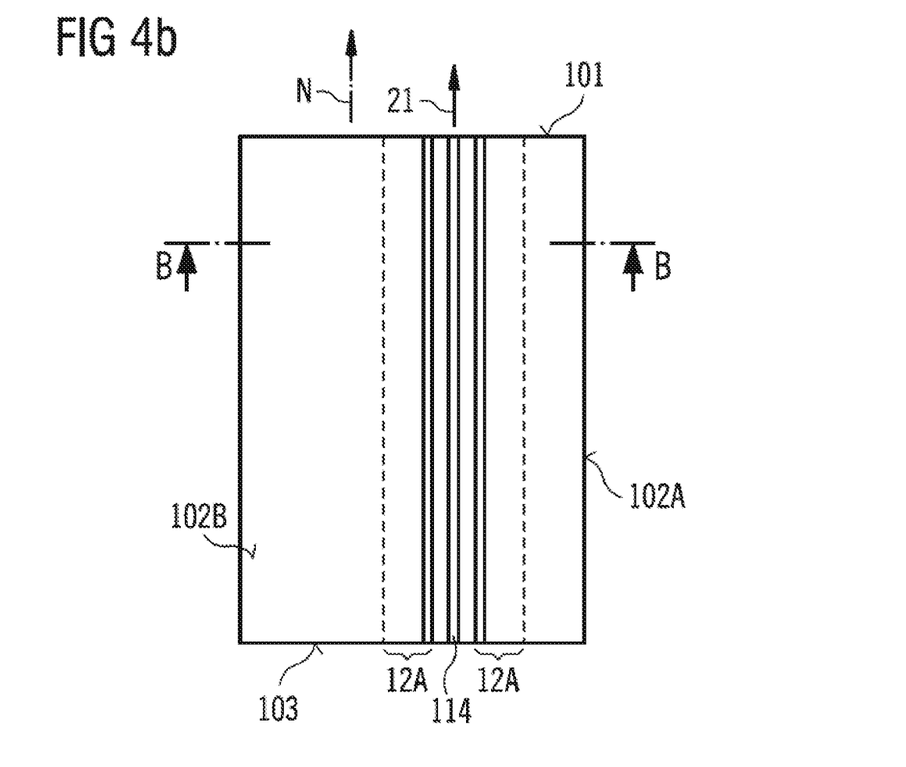
FIG. 4B shows a schematic plan view of the semiconductor body of FIG. 4A.

FIGS. 4A and 4B illustrate a schematic cross-section (FIG. 4A) and a schematic plan view (FIG. 4B) of a semiconductor body 10 of a semiconductor laser light source in accordance with a fourth exemplified embodiment.

The semiconductor body 10 comprises first light-diffusing sub-regions 12A which extend from the p-side external surface 102B into the p-type layer 113 of the semiconductor layer stack 110, through the active layer 112 and into the n-type layer 111. In this case, their main extension plane E is, in contrast to e.g. the first exemplified embodiment, not in parallel with the vertical direction V but instead extends in an inclined manner with respect to this direction. In particular, the first light-diffusing sub-regions 12A are formed in such a manner that, in the progression from the n-type layer 111 towards the p-type layer 113, they run laterally up to the waveguide ridge 114.

In addition, the semiconductor body 10 in accordance with the fourth exemplified embodiment contains second light-diffusing sub-regions 12B which extend starting from the n-side external surface 102C—opposite to the waveguide ridge 114—of the n-type layer 111 into the semiconductor body 10. In particular, they run obliquely up to the active layer 112 but extend in particular completely within the n-type layer 111. They extend e.g. over at least 50% of the layer thickness, that is to say, the extension in the vertical direction V, of the n-type layer 111. The main extension planes E of the second light-diffusing sub-regions extend in each case at an angle, i.e. in particular not in parallel with the vertical direction V, but preferably in parallel with the normal vector N onto the decoupling surface 101 provided for decoupling the coherent portion 21 of the electromagnetic radiation.

In the present case, the first light-diffusing sub-regions are laterally spaced apart from the waveguide ridge 14. In contrast, as seen in a plan view of the p-side external surface 102B at least one second light-diffusing sub-region 12B overlaps with the waveguide ridge 114.

The light-diffusing sub-regions 12A, 12B are produced e.g. by means of cuts in the semiconductor body 10. The cuts can be produced e.g. by means of reactive ion etching. In the present case, the light-diffusing sub-regions 12A, 12B extend from the decoupling surface 101 to the opposite transverse lateral surface 103 over the entire length of the semiconductor body 10.

The first light-diffusing sub-regions 12A are particularly well suited for improving the beam quality in the lateral direction, that is to say, in the main extension plane of the active layer 112. The second light-diffusing sub-regions 12B are particularly well suited for improving the beam quality of the semiconductor laser light source in the vertical direction V.

Each light-diffusing sub-region 12A, 12B is provided in order to direct electromagnetic radiation, which is generated by the active layer 112, towards an external surface or a plurality of external surfaces—e.g. the longitudinal lateral surfaces 102A, the p-side external surface 102B and/or the n-side external surface 102C—which are different from the decoupling surface 101 and are inclined with respect thereto.

Figure 5A:
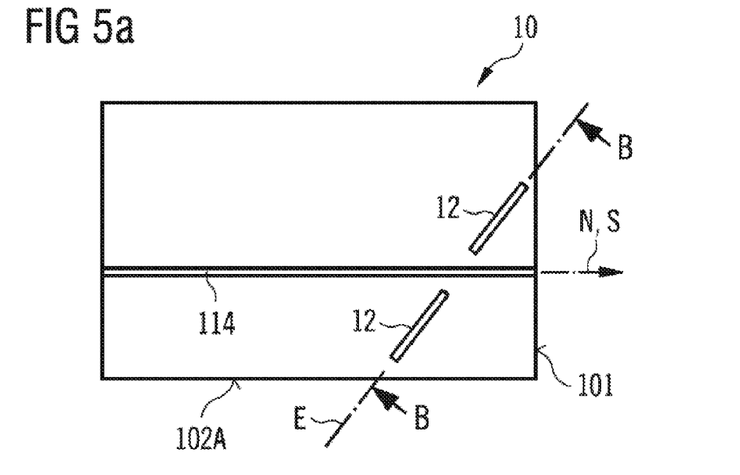
FIG. 5A shows a schematic plan view of a semiconductor body of a fifth laser light source.
Figure 5B:
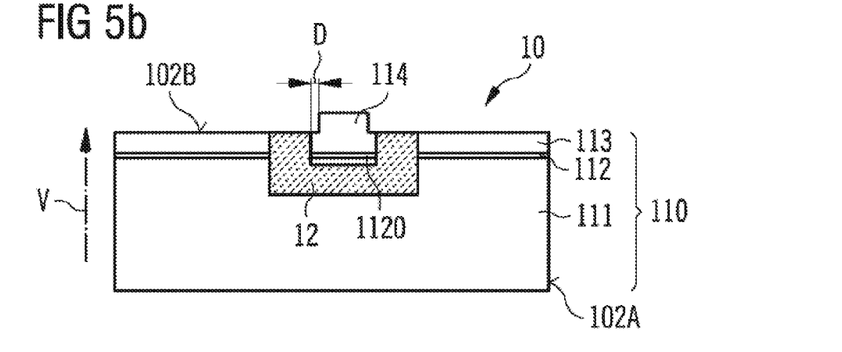
FIG. 5B shows a schematic cross-section of the semiconductor body of FIG. 5A.

FIG. 5A illustrates a semiconductor body of a semiconductor laser light source in accordance with a fifth exemplified embodiment. FIG. 5B illustrates a schematic cross-section of the semiconductor body 10 of FIG. 5A in the sectional plane B-B.

As in the case of the preceding exemplified embodiments, the semiconductor body 10 comprises a semiconductor layer stack 110 having an n-type layer 111, an active layer 112 and a p-type layer 113. In this case, the p-side surface 102B of the p-type layer 113 is structured for forming a waveguide ridge 114.

As in the case of other exemplified embodiments, the main extension direction S of the waveguide ridge coincides in particular with the normal vector N onto the decoupling surface 101 of the semiconductor body 10 which is provided for decoupling a coherent portion 21 of the electromagnetic radiation generated by the active layer 112.

In the case of the present fifth exemplified embodiment, the semiconductor body 10 comprises a light-diffusing sub-region 12 which has a main extension plane E which extends in parallel with the vertical direction V and obliquely with respect to the main extension direction S of the waveguide ridge 114. In the present case, the main extension plane E coincides with the section plane B-B of FIG. 5B.

The light-diffusing sub-region 12, as seen in a plan view of its main extension plane E (and in the present case also in a plan view of the decoupling surface 101) has a U-shaped configuration. In this case, the opening of the U-shape faces towards the p-side external surface 102B, the limbs of the U-shape extend preferably in parallel with the vertical direction V.

Preferably, the light-diffusing sub-region 12 extends from the p-side surface 102B of the semiconductor layer stack 110 and at a lateral spaced interval D from the waveguide ridge 114 into the p-type layer 113, through the active layer 112 and into the n-type layer 111. In the n-type layer, the light-diffusing sub-region 12 comprises e.g. a kink or a bend and extends through underneath the waveguide ridge 114. In the further progression, it has a further kink or bend so that it extends on the opposite side of the waveguide ridge 114, again laterally spaced apart therefrom—in particular likewise by the spaced interval D—through the active layer 112 and the p-type layer 113 to the p-side surface 102B of the semiconductor layer stack 110. In this manner, the light-diffusing sub-region 12 encloses a section 1120 of the active layer 112.

Preferably, a spaced interval of the light-diffusing sub-region 12 from the decoupling surface 101 is less than the spaced interval of the light-diffusing sub-region 12 from the opposite, in particular mirror-coated transverse lateral surface of the semiconductor body 10. The spaced interval last referred to is preferably at least twice as large, particularly preferably four times as large, as the spaced interval of the light-diffusing sub-region 12 with respect to the decoupling surface 101. In this manner, a particularly large amount of electromagnetic radiation from parasitic laser modes can advantageously be decoupled and optionally supplied to a photodiode.

The extension of the light-diffusing sub-region 12 perpendicular to its main extension plane E is preferably at the most half, particularly preferably at the most 20%, of its largest extension in the main extension plane E. In other words, the light-diffusing sub-region 12 constitutes a diagonally extending, light-diffusing wall within the semiconductor body 10 which is "pierced" by the waveguide ridge 114. For example, as seen in a plan view of the p-side external surface 102B the wall has an extension between 5 µm and 500 µm in parallel with its main extension plane E and has an extension between 1 µm and 50 µm perpendicular to the main extension plane E, wherein in each case the limits are to be regarded as being inclusive. In this case, the extension in parallel with the main extension plane E is preferably larger than the extension perpendicular thereto, in particular at least twice as large.

Figure 5C:
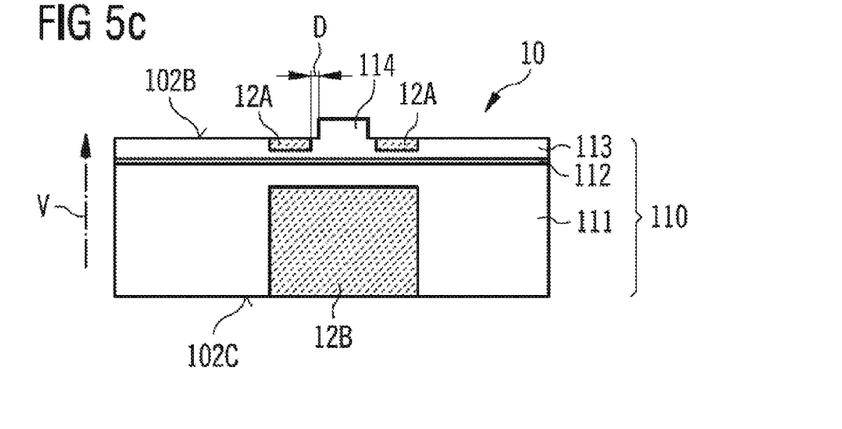
FIG. 5C shows a schematic cross-section of a semiconductor body in accordance with one variant of the fifth laser light source.

FIG. 5C illustrates a variant of the semiconductor body in accordance with the fifth exemplified embodiment in a schematic sectional view in the sectional plane B-B of FIG. 5A.

Instead of an individual, U-shaped, light-diffusing sub-region 12, in the case of this variant two first light-diffusing sub-regions 12A are formed which extend completely within the p-type layer 113 and are laterally spaced apart from the waveguide ridge 114 by a spaced interval D. Arranged in the vertical direction V below the waveguide ridge 114 is a second light-diffusing sub-region 12B which extends completely within the n-type layer 111 and, as seen in a plan view of the p-type layer 113, overlaps with the waveguide ridge 114 and the first light-diffusing sub-regions 12A. The outer contours—facing away from the waveguide ridge 114—of the first light-diffusing sub-regions 12A and of the second light-diffusing sub-region 12B are, particularly in this plan view, flush with one another.

The light-diffusing sub-regions in accordance with this variant can be produced in a particularly simple manner by structuring starting from the p-type layer 113 and starting from the n-type layer 111. In contrast thereto, the production of the light-diffusing sub-region of the fifth exemplified embodiment in accordance with the FIGS. 5A and 5B is more complex—production can be effected by means of the stealth dicing method which is already explained in greater detail above. However, by means of this light-diffusing sub-region 12 it is possible to achieve particularly effective diffusion of a fraction of the electromagnetic radiation which is undesired for decoupling at the decoupling surface 101.

The portion—extending in the n-type layer 111—of the light-diffusing sub-region 12 of the fifth exemplified embodiment, or the second light-diffusing sub-region 12B of the variant of the fifth exemplified embodiment extend preferably over 10% or more, particularly preferably over 30% or more, in particular over 50% or more of the thickness of the n-type layer 111.

Figure 6:
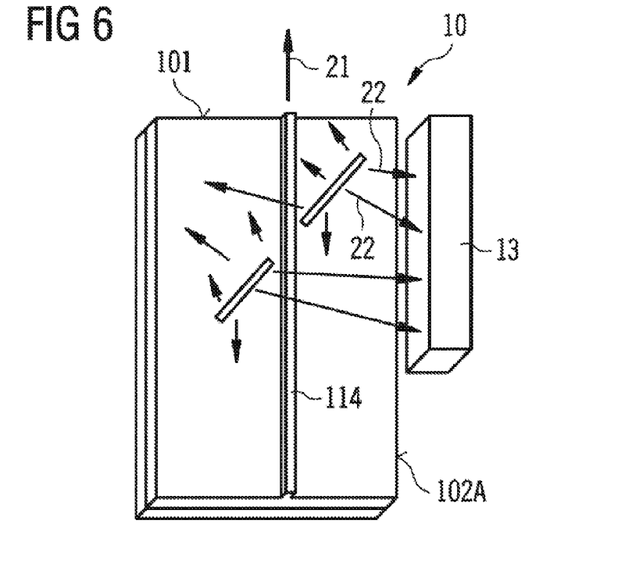
FIG. 6 shows a schematic perspective view of a sixth laser light source.

FIG. 6 illustrates a schematic perspective view of a semiconductor laser light source in accordance with a sixth exemplified embodiment. The semiconductor laser light source in accordance with the present sixth exemplified embodiment comprises a semiconductor body 10 which is constructed in the manner as described in conjunction with the fifth exemplified embodiment with reference to FIGS. 5A and 5B or with the variant of the fifth exemplified embodiment with reference to FIGS. 5A and 5C.

In addition, the semiconductor laser light source in accordance with the sixth exemplified embodiment comprises a photodiode 13. In the present case, the photodiode 13 is arranged next to a longitudinal lateral surface 102A of the semiconductor body 10. The light-diffusing sub-region 12 deflects a portion 22 of the electromagnetic radiation generated by the active layer 112 in the direction of the longitudinal lateral surface 102A, where it is decoupled at least partially from the semiconductor body 10 and coupled into the photodiode 13.

Figure 7:
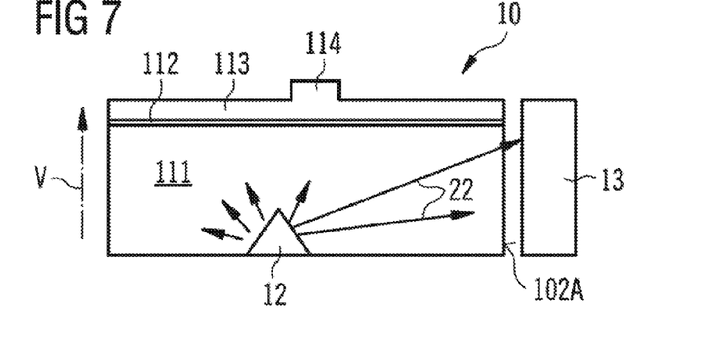
FIG. 7 shows a schematic cross-section of a seventh laser light source.

FIG. 7 illustrates a schematic cross-section of a semiconductor laser light source in accordance with a seventh exemplified embodiment.

The semiconductor laser light source in accordance with the seventh exemplified embodiment comprises a semiconductor body 10 having a light-diffusing sub-region 12 which extends completely within the n-type layer 111 and has the shape of a straight prism having a triangular base surface. The normal vectors N on the triangular base surface and on the decoupling surface 101 are parallel, so that the prism extends longitudinally of the waveguide ridge 114 and, as seen in the plan view of the p-side external surface, preferably overlaps therewith.

As in the case of the preceding exemplified embodiment, the light-diffusing sub-region 12 diffuses a portion 22 of the electromagnetic radiation generated by the semiconductor layer stack 110 towards a longitudinal lateral surface 102A, where it is at least partially decoupled and is at least partially coupled into the photodiode 13 arranged adjacent to the longitudinal lateral surface 102A.

Such a prismatic light-diffusing sub-region 12 is particularly well suited for irradiating a photodiode 13 arranged on the longitudinal side.

Figure 8:
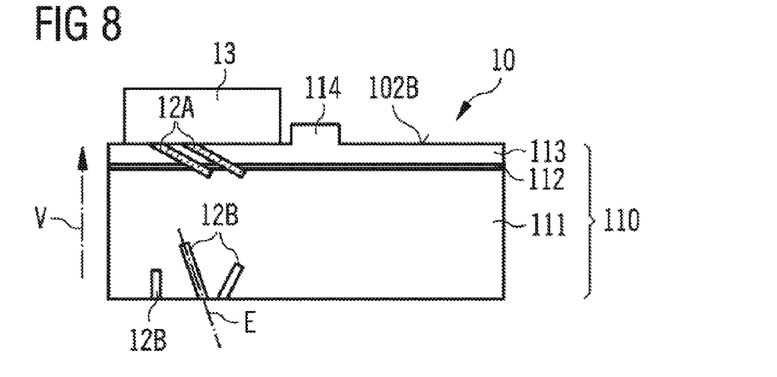
FIG. 8 shows a schematic cross-section of an eighth laser light source.

FIG. 8 illustrates a schematic cross-section of a semiconductor laser light source in accordance with an eighth exemplified embodiment.

The light-diffusing sub-regions 12A, 12B of the semiconductor body 10 of the semiconductor laser light source in accordance with the eighth exemplified embodiment are formed in a similar manner to those of the semiconductor body 10 in accordance with the fourth exemplified embodiment (see FIGS. 4A and 4B).

However, in the case of the present exemplified embodiment, the first light-diffusing sub-regions 12A, in the progression from the n-type layer 111 to the p-type layer 113 of the semiconductor layer stack 110, do not run up to the waveguide ridge 114 but rather run away therefrom. They are laterally spaced apart from the waveguide ridge 114 and, as seen in a plan view of the p-side external surface of the semiconductor body 10, overlap with a photodiode 13 which is arranged laterally next to the waveguide ridge 14 on the p-side external surface 102B of the semiconductor body 10.

In addition, the semiconductor body 10 also comprises second light-diffusing sub-regions which are located completely within the n-type layer 111 and have main extension planes E which extend obliquely with respect to the vertical direction V and in parallel with the normal vector N onto the decoupling surface 101 (perpendicular the drawing plane in FIG. 8). As seen in a plan view of the p-side external surface 102B of the semiconductor body 10, the second light-diffusing sub-regions 12B likewise overlap with the photodiode 13 applied on this external surface 102B. In this manner, a portion 22 of the electromagnetic radiation generated by the active layer 112 is directed in a particularly efficient manner towards the p-side external surface 102 and in particular towards the photodiode 13.

Figure 9:
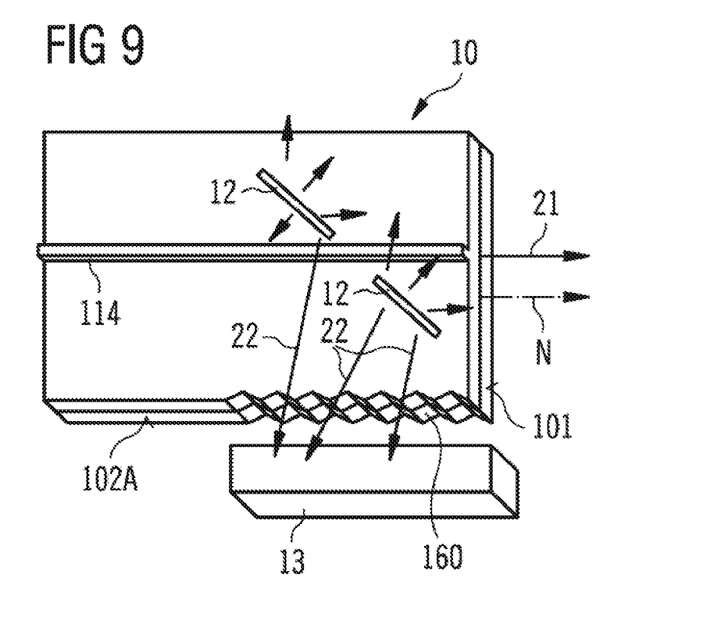
FIG. 9 shows a schematic perspective view of a ninth laser light source.

FIG. 9 illustrates a schematic perspective view of a semiconductor laser light source in accordance with a ninth exemplified embodiment. The semiconductor laser light source in accordance with this exemplified embodiment corresponds substantially to that of the sixth exemplified embodiment which is described above in conjunction with FIG. 6.

In contrast to the sixth exemplified embodiment, in the case of the present ninth exemplified embodiment the longitudinal lateral surface 102A which faces towards the photodiode 13 is provided with light-diffusing structures 160. For example, a portion of the longitudinal lateral surface 102A which as seen in a plan view of the longitudinal lateral surface 102A overlaps with the photodiode 13 is provided with the light-diffusing structures 160, whereas a portion which is not covered by the photodiode is free of light-diffusing structures. Alternatively, the entire longitudinal lateral surface 102A can also be provided with the light-diffusing structures.

The light-diffusing structures are either macroscopic structures, wherein in the present case "macroscopic structures" are understood to mean that their dimensions at least in one dimension are larger than 10 µm, preferably larger than 100 µm. However, the light-diffusing structures can also be formed by roughening which is formed in such a manner that it is suitable for diffusing electromagnetic radiation having a wavelength of an intensity maximum of the coherent portion 21. For example, the roughening therefore contains structure units having lateral dimensions between 100 nm and 1 µm, wherein in each case the limits are to be regarded as being inclusive.

Figure 10:
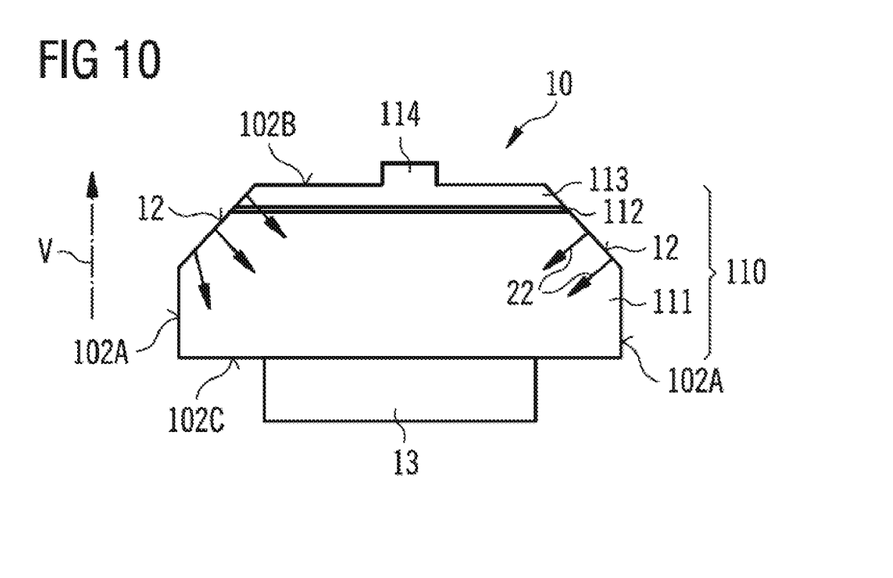
FIG. 10 shows a schematic cross-section of a tenth laser light source.

FIG. 10 illustrates a schematic cross-section of a semiconductor laser light source in accordance with a tenth exemplified embodiment.

It comprises a semiconductor body 10 whose longitudinal lateral surfaces 102A are chamfered in a p-side edge region for forming light-diffusing sub-regions 12. The oblique sub-regions of the longitudinal lateral surfaces 102A extend in the present case from the p-side external surface 102B of the semiconductor body 10 in the vertical direction V beyond the active layer 112 into the n-type layer 111. By means of these light-diffusing sub-regions 112, a portion 22 of the electromagnetic radiation generated by the active layer 112 is directed in the direction of the n-side external surface 102C of the semiconductor body. Arranged on this n-side external surface 102C or above this n-side external surface 102C is a photodiode 13 which is formed for receiving at least a portion of this electromagnetic radiation 22.

Figure 11:
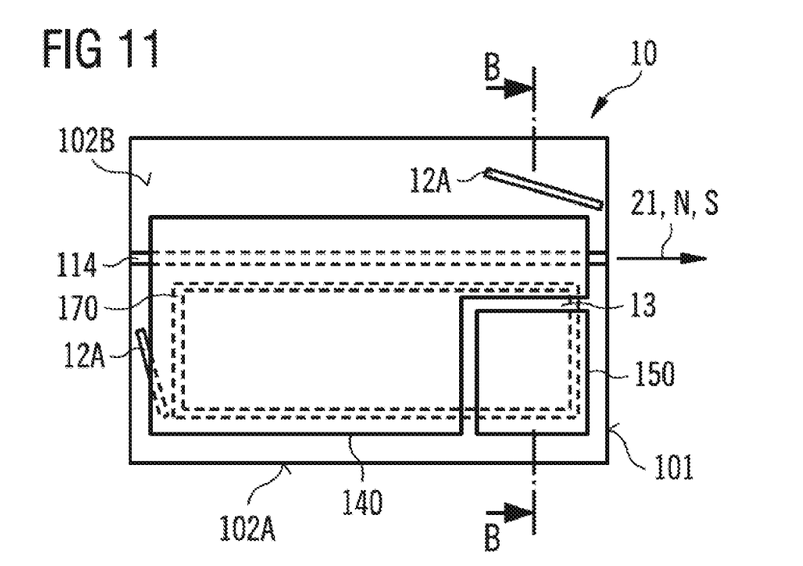
FIG. 11 shows a schematic plan view of an eleventh laser light source.
Figure 14:
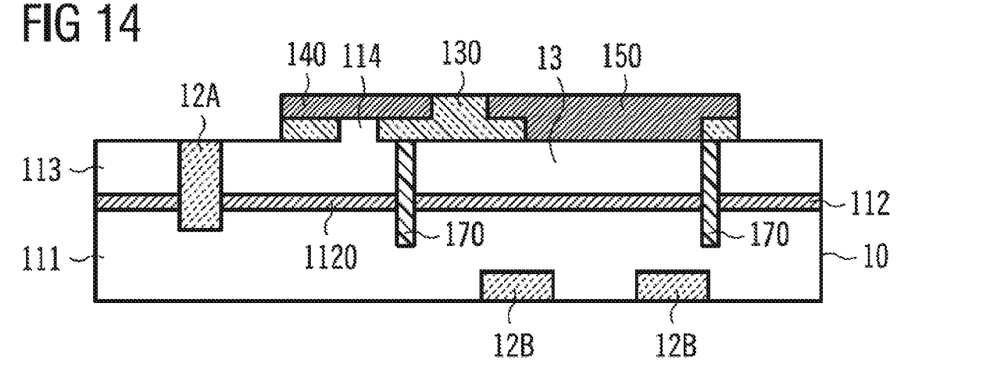
FIG. 14 shows a schematic cross-section of the eleventh laser light source.

FIG. 11 illustrates a schematic plan view of a semiconductor laser light source in accordance with an eleventh exemplified embodiment. FIG. 14 illustrates a schematic cross-section of the semiconductor laser light source of FIG. 11 in the sectional plane B-B.

In the case of the present semiconductor laser light source, the photodiode 13 is formed so as to be integrated into the semiconductor body 10.

For example, a section 1120 of the active layer 112 which, as seen in a plan view of the p-side external surface 102B, overlaps with the waveguide ridge 114 is formed for generating the electromagnetic radiation and in particular the coherent portion 21 of the electromagnetic radiation. This section 1120 is contacted by the electrode 140, as described e.g. in conjunction with the third exemplified embodiment.

A further section of the active layer 112 is electrically separated from the section 1120 by means of an isolator 170 and is electrically contacted by a further electrode 150. For example, the passivation 130 which is applied onto the p-side external surface 102B extends as an isolator 170 into a trench which is formed longitudinally of the waveguide ridge 114 in the semiconductor layer stack 110 and which separates the active layer 112.

The semiconductor body 10 comprises first light-diffusing structures 12A which are formed in order to direct electromagnetic radiation, which is generated by the section 1120 of the active layer 112, in the direction of the longitudinal lateral surfaces 102A, so that it impinges in particular upon the monolithically integrated photodiode 13.

Second light-diffusing sub-regions 12B are formed in the n-type layer 111 and, as seen in a plan view of the p-side external surface 102B, overlap in particular with the photodiode 13. In an expedient manner, they are formed in order to direct electromagnetic radiation generated by the active layer 112 in the direction of the p-side external surface 102B, so that it impinges in particular upon the portion of the active layer 112 separated for forming the photodiode 13.

In the case of the eleventh exemplified embodiment, the photodiode extends in the main extension direction S of the waveguide ridge 114 over a large part of the length of the semiconductor body 10, e.g. over 80% or more of the length of the semiconductor body 10.

Figure 12:
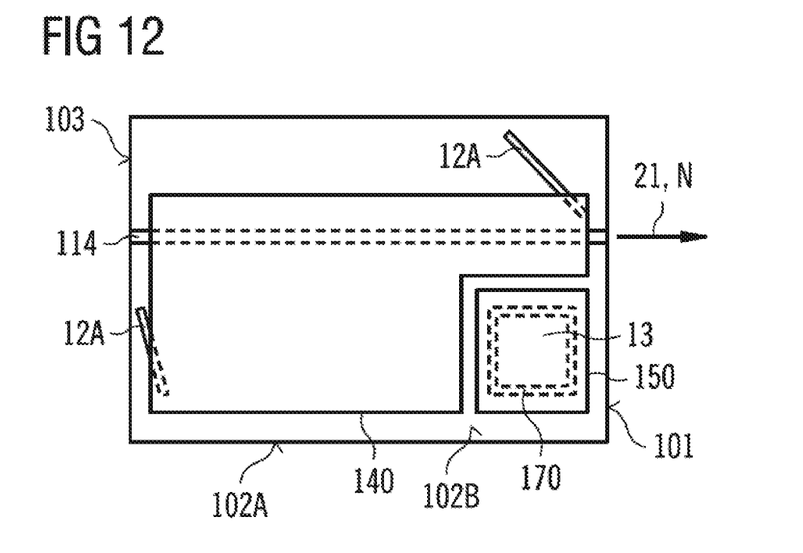
FIG. 12 shows a schematic plan view of a twelfth laser light source.

FIG. 12 illustrates a schematic plan view of a semiconductor laser light source in accordance with a twelfth exemplified embodiment.

The semiconductor laser light source in accordance with the present twelfth exemplified embodiment corresponds to that of the eleventh exemplified embodiment, however the photodiode 13 does not extend over a large part of the length of the semiconductor body 10 but rather it is formed in the vicinity of the decoupling surface 101. In particular, in the case of the present twelfth exemplified embodiment, the spaced interval of the photodiode 13 from the transverse lateral surface 103 which is opposite to the decoupling surface 101 is preferably at least twice as large, particularly preferably at least four times as large as the spaced interval of the photodiode 13 from the decoupling surface 101.

Figure 13:
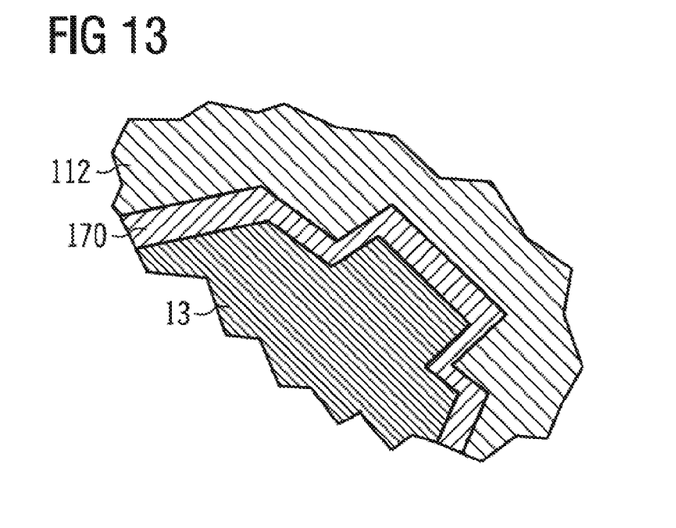
FIG. 13 shows a section of the semiconductor body of the eleventh laser light source in a schematic plan view of its active layer.

FIG. 13 illustrates a section of a longitudinal sectional view which extends in the active layer 112 through the semiconductor body 10 of a laser light source in accordance with a variant of the eleventh and twelfth exemplified embodiments. In the case of this variant, the photodiode 13 does not have a rectangular or square geometry as in the case of the eleventh or twelfth exemplified embodiment, but rather is formed as an irregular polygon.

The semiconductor laser light sources in accordance with the first to fifth exemplified embodiments can likewise each comprise a photodiode 13 which is arranged e.g. at a longitudinal lateral surface 102A, on the p-side external surface 102B or the n-side external surface 102C of the semiconductor body 10 or is adjacent to one of these surfaces.

In the case of each exemplified embodiment, the semiconductor laser light source can comprise an electrical circuit which is electrically connected to the semiconductor layer stack 110 and to the photodiode 13 and is formed in order, during operation of the semiconductor laser light source, to evaluate an electrical signal of the photodiode 13 and to control an operating current through the semiconductor layer sequence 110 in dependence upon the signal of the photodiode 13.

The different embodiments of the light-diffusing sub-regions 12, 12A, 12B, 12C of the individual exemplified embodiments can be combined together in a semiconductor body 10.

Moreover, the invention is also not limited to the exemplified embodiments by the description thereof. Rather, the invention includes any new feature and any combination of features, in particular any combination of features in the claims and any combination of features in the exemplified embodiments, even if this combination is not explicitly stated in the claims or exemplified embodiments.

The invention claimed is:

1. Semiconductor laser light source comprising an edge-emitting semiconductor body which contains a semiconductor layer stack having an n-type layer, an active layer and a p-type layer which is formed for generating electromagnetic radiation which comprises a coherent portion, wherein
the semiconductor laser light source is formed for decoupling the coherent portion of the electromagnetic radiation from a decoupling surface of the semiconductor body which is inclined with respect to the active layer,
the semiconductor body comprises a further external surface which is inclined with respect to the decoupling surface,
the semiconductor body comprises at least one light-diffusing sub-region which is provided in order to direct a portion of the electromagnetic radiation generated by the semiconductor layer stack in the direction towards the further external surface,
the semiconductor laser light source comprises a photodiode which is arranged on or above the further external surface of the semiconductor body, wherein at least one region of the further external surface is roughened or provided with macroscopic decoupling structures.

2. Semiconductor laser light source according to claim 1, wherein the at least one light-diffusing sub-region extends starting from the n-type layer or starting from the p-type layer into the active layer or through the active layer.

3. Semiconductor laser light source according to claim 1, wherein the semiconductor body comprises a waveguide ridge which is formed by the semiconductor layer stack and has a main extension direction which extends in the direction of a normal vector onto the decoupling surface.

4. Semiconductor laser light source according to claim 3, wherein the at least one light-diffusing sub-region extends at least in the p-type layer and is laterally spaced apart from the waveguide ridge in the region of the p-type layer.

5. Semiconductor laser light source according to claim 3, wherein the at least one light-diffusing sub-region is formed by means of a transverse ridge which is applied at the side of the waveguide ridge onto the semiconductor layer stack or is formed by the semiconductor layer stack.

6. Semiconductor laser light source according to claim 5, wherein the refractive index of the transverse ridge is different from the refractive index of the waveguide ridge.

7. Semiconductor laser light source according to claim 1, which comprises a first and a second light-diffusing sub-region, wherein the first light-diffusing sub-region extends at least in the n-type layer, the second light-diffusing sub-region extends at least in the p-type layer and, as seen in a plan view of the decoupling surface, the first and the second light-diffusing sub-regions do not overlap or overlap only partially in a vertical direction, in which the n-type layer, the active layer and the p-type layer follow one another.

8. Semiconductor laser light source according to claim 1, wherein in order to form the at least one light-diffusing sub-region a cavity is formed in the semiconductor body.

9. Semiconductor laser light source according to claim 1, wherein the at least one light-diffusing sub-region is formed by means of a material composition and/or crystal structure in the semiconductor body which deviate from the material composition or crystal structure which a region of the semiconductor body adjoining the sub-region comprises.

10. Semiconductor laser light source according to claim 1, wherein the at least one light-diffusing sub-region has a main extension plane which extends in an inclined manner with respect to a vertical direction, in which the n-type layer, the active layer and the p-type layer follow one another.

11. Semiconductor laser light source according to claim 1, wherein the at least one light-diffusing sub-region has a main extension plane which extends in an inclined manner with respect to a normal vector onto the decoupling surface.

12. Semiconductor laser light source according to claim 1, wherein the light-diffusing sub-region is formed in a u-shaped manner as seen in a plan view of the decoupling surface such that it encloses a section of the active layer.

13. Semiconductor laser light source according to claim 1, wherein each of the macroscopic decoupling structures extends by at least 10 µm in at least one dimension.

14. Semiconductor laser light source according to claim 1, wherein the photodiode is arranged adjacent to a longitudinal lateral surface of the semiconductor body.

15. Semiconductor laser light source according to claim 1, wherein the semiconductor body comprises a waveguide ridge, and wherein the photodiode is arranged laterally next to the waveguide ridge on the p-side external surface of the semiconductor body.

16. Semiconductor laser light source comprising an edge-emitting semiconductor body which contains a semiconductor layer stack having an n-type layer, an active layer and a p-type layer which is formed for generating electromagnetic radiation which comprises a coherent portion, wherein
the semiconductor laser light source is formed for decoupling the coherent portion of the electromagnetic radiation from a decoupling surface of the semiconductor body which is inclined with respect to the active layer,
the semiconductor body comprises a further external surface which is inclined with respect to the decoupling surface,
the semiconductor body comprises at least one light-diffusing sub-region which is provided in order to direct a portion of the electromagnetic radiation generated by the semiconductor layer stack in the direction towards the further external surface,
the at least one light-diffusing sub-region extends starting from the n-type layer or starting from the p-type layer into the active layer or through the active layer, and
the at least one light-diffusing sub-region is formed by means of a material composition and/or crystal structure in the semiconductor body which deviate(s) from the material composition or crystal structure which a region of the semiconductor body adjoining the sub-region comprises.

17. Semiconductor laser light source according to claim 16, comprising a photodiode which is integrated monolithically into the semiconductor body.

18. Semiconductor laser light source according to claim 17, wherein a material having a refractive index which is larger than a refractive index of the photodiode and which is larger than a refractive index of the active layer is arranged between the photodiode and a section of the active layer adjoining the photodiode.

* * * * *